United States Patent
Taylor et al.

(10) Patent No.: US 7,418,642 B2
(45) Date of Patent: Aug. 26, 2008

(54) BUILT-IN-SELF-TEST USING EMBEDDED MEMORY AND PROCESSOR IN AN APPLICATION SPECIFIC INTEGRATED CIRCUIT

(75) Inventors: Richard D. Taylor, Eagle, ID (US); Mark D. Montierth, Meridian, ID (US); Melvin D. Bodily, Boise, ID (US); Gary Zimmerman, Boise, ID (US); John D. Marshall, Boise, ID (US)

(73) Assignee: Marvell International Technology Ltd., Hamilton (BM)

( * ) Notice: Subject to any disclaimer, the term of this patent is extended or adjusted under 35 U.S.C. 154(b) by 605 days.

(21) Appl. No.: 09/917,972

(22) Filed: Jul. 30, 2001

(65) Prior Publication Data

US 2003/0023914 A1    Jan. 30, 2003

(51) Int. Cl.
  *G01R 31/28*    (2006.01)
(52) U.S. Cl. .............................. 714/733; 714/734
(58) Field of Classification Search ............... 714/733, 714/734, 738, 742, 46, 30, 31, 724–725, 714/38; 716/4
  See application file for complete search history.

(56) References Cited

U.S. PATENT DOCUMENTS

| | | | | |
|---|---|---|---|---|
| 5,029,071 A | * | 7/1991 | Kinoshita | 714/11 |
| 5,051,997 A | * | 9/1991 | Sakashita et al. | 714/732 |
| 5,668,815 A | * | 9/1997 | Gittinger et al. | 714/719 |
| 5,732,209 A | * | 3/1998 | Vigil et al. | 714/30 |
| 5,883,843 A | | 3/1999 | Hii et al. | |
| 5,961,653 A | | 10/1999 | Kalter et al. | |
| 6,055,649 A | * | 4/2000 | Deao et al. | 714/30 |
| 6,067,262 A | * | 5/2000 | Irrinki et al. | 365/201 |
| 6,112,298 A | * | 8/2000 | Deao et al. | 712/227 |
| 6,230,290 B1 | | 5/2001 | Heidel et al. | |
| 6,233,701 B1 | * | 5/2001 | Onoue | 714/33 |
| 6,249,889 B1 | * | 6/2001 | Rajsuman et al. | 714/718 |
| 6,249,893 B1 | * | 6/2001 | Rajsuman et al. | 714/741 |
| 6,427,216 B1 | * | 7/2002 | El-Kik et al. | 714/726 |
| 6,550,020 B1 | * | 4/2003 | Floyd et al. | 714/10 |
| 6,564,347 B1 | * | 5/2003 | Mates | 714/727 |
| 6,681,354 B2 | * | 1/2004 | Gupta | 714/725 |
| 6,697,979 B1 | * | 2/2004 | Vorbach et al. | 714/724 |
| 6,725,407 B2 | * | 4/2004 | Richter et al. | 714/733 |
| 6,983,398 B2 | * | 1/2006 | Prabhu | 714/12 |
| 6,988,784 B2 | * | 1/2006 | Silverbrook | 347/29 |
| 2002/0104051 A1 | * | 8/2002 | Gupta | 714/733 |

FOREIGN PATENT DOCUMENTS

WO    WO 0008479    7/1999

* cited by examiner

*Primary Examiner*—Phung M Chung

(57) ABSTRACT

A test method for an ASIC uses an embedded processor in the ASIC to execute test routines from an embedded memory or an external memory. During ASIC production, the test routines can comprehensively test of the blocks of the ASIC without a complicated test pattern from test equipment. The test routines can also perform power-up tests in systems or end products containing the ASIC. Test selection, activation, and result output can be implement using a few terminals of the ASIC.

13 Claims, 3 Drawing Sheets

BUILT-IN-SELF-TEST USING EMBEDDED MEMORY AND PROCESSOR IN AN APPLICATION SPECIFIC INTEGRATED CIRCUIT

BACKGROUND

Application specific integrated circuits (ASICs) must be tested under a variety of circumstances. For example, during development, an ASIC generally requires thorough testing and debugging to verify or fix the design of the integrated circuit. During production, ASICs generally must be tested to separate good chips from bad chips. During use, an ASIC is often tested to determine whether the integrated circuit is functioning properly in a system.

One method for testing an ASIC during production uses a traditional ASIC tester such as an Agilent 83000 F330 to apply test patterns to the terminals of the ASIC. The test patterns ideally exercise all of the functional paths of the ASIC and can uncover any defects in the ASIC. Developing the test patterns required for thorough testing can take significant development effort. In particular, developing a test pattern that exercises all functional paths in multiple functional units including embedded memory can be difficult. Additionally, when an ASIC includes an interface to external memory, the test patterns must emulate the external memory, and developing a test pattern that emulates the timing of a high-speed external memory can be time consuming particularly when the ASIC uses a serial interface to reduce pin count.

Even if an exhaustive test pattern is developed, running through a complex test pattern during testing of an ASIC generally requires time, which potentially increases the manufacturing cost of the ASIC. Less exhaustive test patterns can reduce test times, but simpler test patterns may not catch as many defects, resulting in more defective chips being delivered to customers.

Another limitation of ASIC tests requiring a tester is that such tests are limited to production or development of the ASICs and generally are impractical for testing of an ASIC in commercial product or system. Accordingly, ASICs need at least two types of tests, a test implemented with an external tester and a built-in self-test (BIST) that the ASIC performs in a product. Developing both tests requires duplicated effort and expense.

BIST tests are generally implemented using special BIST logic that applies deterministic signal patterns in an attempt to exercise the logic paths. Developing BIST logic that performs exhaustive tests is difficult both because there is no guarantee that the paths exercised are the actual functional paths and because creating the test logic often requires specialized design tools. Once produced, such logic is often complicated, increases the ASICs size and cost, and can be overhead that decreases the ASICs performance.

In view of the difficulties involved in testing, more efficient testing methods and structures are sought for testing ASICs during development, production, and use.

SUMMARY

In accordance with an aspect of the invention, an ASIC with an embedded processor executes test routines to test the operation of the ASIC. The test routines can perform at-speed functional tests of circuit blocks such as embedded memory, coders and decoders, and interfaces to external devices. The test implementation requires a small amount of IC area associated with the memory storing the test routines. External test equipment can use a simple test pattern that in one embodiment of the invention only involves three pins of the ASIC. Accordingly, the production testing can be performed quickly with simple test equipment and without burdening the ASIC with complex test logic. Additionally, the same or similar test routines in the embedded memory can be used in a self-test when the ASIC is in a product.

One embodiment of the invention is an integrated circuit including a processing core and a non-volatile memory containing test routines that the processing core executes to test the integrated circuit. An interface block in the integrated circuit can handle signals associated with testing. In particular, the processing core executes the test routines selected according to control signals input via the interface block.

In one embodiment, the interface block includes first and second terminals. The processing core use a first signal on the first terminal to indicate a test result, i.e., to indicate whether execution of the test routines detected a defect in the integrated circuit. On the second terminal, the processing core activates a second signal to indicate when the first signal indicates the test result. A third terminal can receive a control signal for selection of the test routines from embedded memory for a production test or a system-level test or for selection of execution of firmware downloaded from external memory.

Functional blocks in the integrated circuit can include data paths that facilitate software testing of the blocks. For example, an input buffer that normally receives data input from an external source can be connected so that the processor can write to the input buffer to test data flow through the input buffer. To reduce the need for test routines that monitor an entire data stream, check code or CRC calculators can be added to specific units to provide a code that is easily checked to detect errors. Further loop-back capabilities can be added to facilitate testing of the data from in and out of network interfaces.

Another embodiment of the invention is a test method for an integrated circuit. The test method uses an embedded processing core in the integrated circuit to execute test routines stored in an embedded non-volatile memory in the integrated circuit. The test routines can implement complicated tests such as exhaustive testing of an internal memory or other functional blocks of the integrated circuit and output a signal that a tester observes to determine a test result. Generally, a first signal indicates whether the execution of the test routines detected a failure in the integrated circuit. The processing core in executing the test routines can activate a second signal to indicate when a state of the first signal indicates whether the test routines detected a failure. The first signal can be activated before activation of the second signal to acknowledge or signal that the processing core is executing the test routines. One or more additional signals from the integrated circuit can indicate a type or location of a failure that executing the test routines detected.

A tester during production testing of the integrated circuit thus has a simple test pattern involving only a few pins but obtains a test result from an exhaustive test implemented in the test routines. Additionally, during use of the integrated circuit in a system the system's circuitry can easily initiate a test of the integrated circuit and monitor results.

BRIEF DESCRIPTION OF THE DRAWINGS

Use of the same reference symbols in different figures indicates similar or identical items.

DETAILED DESCRIPTION

In accordance with an aspect of the invention, an ASIC with an embedded processor has test routines in an embedded memory. The embedded processor executes the test routines to test the operation of the ASIC. The test routines may be used for ASIC production tests and system-level power-on self-tests. For highly integrated circuits that already contain an embedded ROM, the overhead logic for these self-test functions is minimal.

Figure 1:
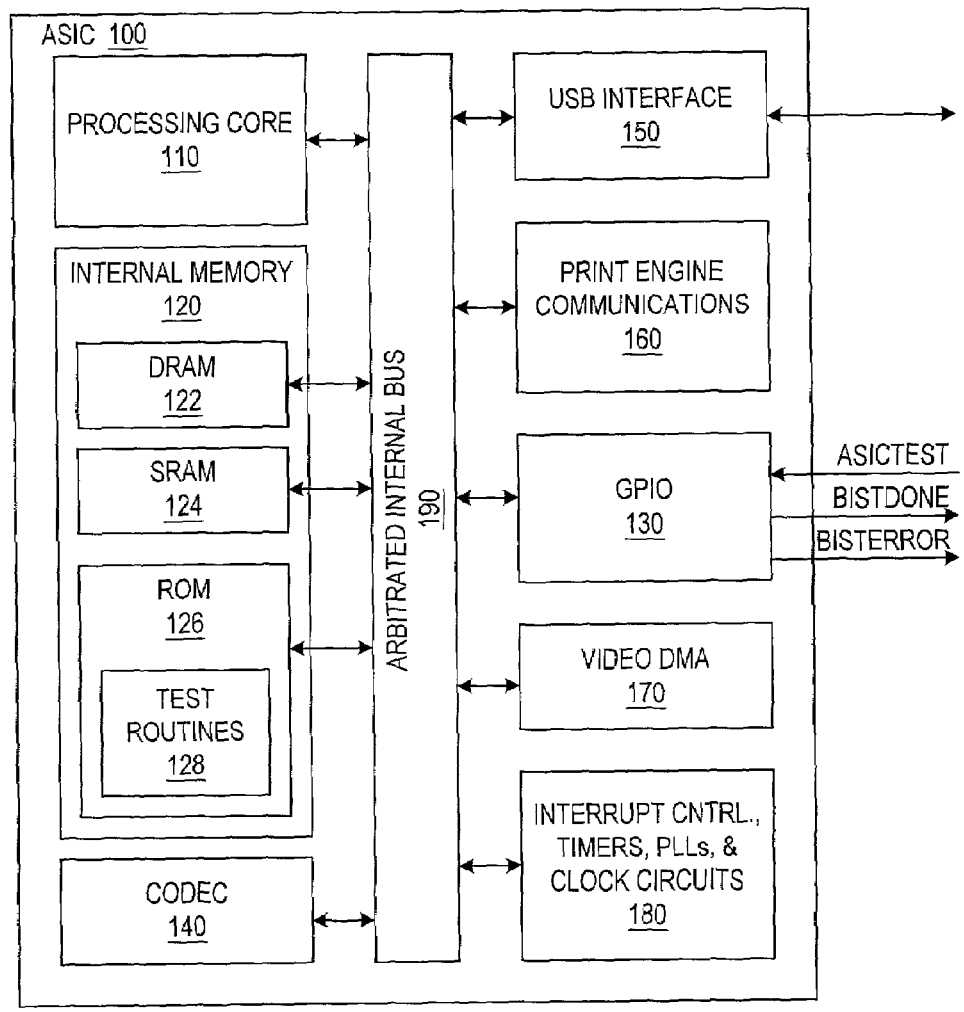
FIG. 1 is a block diagram of an ASIC with self-test capabilities in accordance with an embodiment of the invention.

FIG. 1 is a block diagram of an ASIC 100 in accordance with an exemplary embodiment of the invention. In FIG. 1, ASIC 100 is a formatter for a printer and in an end product would participate in communications between a printer and a host computer (not shown). This exemplary embodiment is described here to provide a concrete example of one ASIC application, but broad aspects of the invention can be used more widely in any integrated circuit or ASIC that contains an embedded processor having sufficient processing power to execute test routines. Embodiments of the invention are clearly not limited to integrated circuits containing the specific functional units of ASIC 100.

As illustrated in FIG. 1, ASIC 100 includes a processing core 110, an internal memory 120, a general purpose input/output (GPIO) interface 130 and functional units including a codec 140, an external device interface 150, a print engine communications unit 160, a DMA unit 170, and timing circuits 180. An arbitrated internal bus 190 conducts communication signals among the various blocks of ASIC 100.

Processing core 110 executes instructions that can be stored in internal memory 120 or external memory (not shown). Any type of processor may be suitable for processor 100, but in an exemplary embodiment of the invention, processing core 110 is an ARM7 processing core, which can be licensed from ARM Ltd.

Internal memory 120 includes volatile memory such as DRAM 122 and SRAM 124 and non-volatile memory such as ROM 126. ROM 126 can be any type of non-volatile memory such as a mask ROM, an EPROM, or an EEPROM and stores firmware including but not limited to test routines 128. An exemplary set of test routines 128 is described further below and generally includes tests of the operation internal memory 120 and associated memory interface circuits and tests of the other functional units 140, 150, 160, 170, and 180.

In the exemplary embodiment, interface 150 operates in a normal mode to implement a universal serial bus (USB) interface for communication with a host computer, but interface 150 can also operate to download firmware as described below. Alternatively, GPIO interface 130 can be used as a memory interface to download firmware from an external memory such as a serial EEPROM. Downloaded firmware can replace all or portions of test routines 128 as described further below. Print engine communications 160 implements a communication interface to a printer, and DMA 170 implements direct memory access for transfer of print images. Codec 140 performs coding and decoding operations on print images.

GPIO interface 130 provides the control and output interface for self-test functions of ASIC 100. In particular, GPIO interface 130 employs three signals, ASICTEST, BISTERROR, and BISTDONE. Processing core 110 checks input signal ASICTEST via GPIO interface 130 to determine whether to execute system-level self-test or an ASIC production test. Test routines 128 will generally include slightly differences for system-level tests or production tests. Processing core 110 controls signals BISTERROR, and BISTDONE to indicate test results.

Figure 2A:
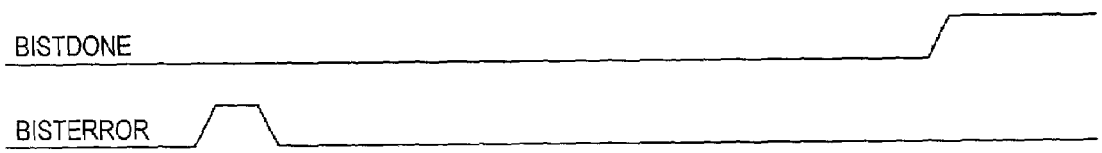
FIGS. 2A and 2B are timing diagrams of output signals for a passed self test and a failed self test, respectively.
Figure 2B:
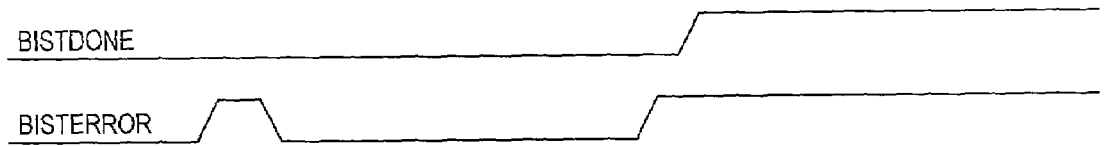

FIGS. 2A and 2B are timing diagrams for signals BISTERROR and BISTDONE and respectively illustrate a passed self-test and a failed self-test in the exemplary embodiment of the invention.

In FIG. 2A, processing core 110 executes test code 128 (for production or system-level testing) in response to a reset of ASIC 100. Processing core 110 begins by activating single BISTERROR for a short period (e.g., about 100 ns) to demonstrate that signal BISTERROR is functional. External test equipment (not shown) detects a failure if processing core 110 fails to activate signal BISTERROR within a period after activation of the reset signal. After deactivating signal BISTERROR, processing core 110 executes the portions of test routines 128 that input control signals such as signal ASICTEST designate. For the example of FIG. 2A, no error is detected, and processing core 110 activates signal BISTDONE upon completing execution of test routines 128. External test equipment during production testing or system circuitry during in system testing identifies the passed self-test from the toggling of signal BISTERROR followed by the activation of signal BISTDONE while signal BISTERROR is in a state indicating no error (e.g., inactive).

In FIG. 2B, processing core 110 again toggles single BISTERROR to demonstrate signal BISTERROR is functional and then executes the portions of test routines 128 designated by the input control signals. For the example of FIG. 2B, execution of test routines 128 detects a failure, and processing core 110 reactivates signal BISTERROR and then activates signal BISTDONE to indicate the detection of a test failure. External test equipment or system circuitry identifies the failed self-test from activation of signal BISTDONE while signal BISTERROR is in a state indicating an error (e.g., active). Processing core 100 further can use other output signals from GPIO interface 130 to indicate the type and/or location of the defect or failure.

In the exemplary embodiment of the invention, test routines 128 are part of the boot code that ASIC 100 executes during power up, and test routines 128 include three main portions referred to herein as BIST, EEPROM, and self-test. In the exemplary embodiment of the invention, a control signal input via GPIO interface 130 controls whether processing core 110 executes test routines 128 or attempts to download firmware from external memory via interface 130 or 150. If test routines 128 are executed, processing core 110 starts with the BIST portion of test routines 128.

The BIST portion is executed before the system is setup to use internal memory or the internal operating system of ASIC 100. The BIST portion tests internal DRAM 122 and SRAM 124, e.g., by performing extensive write and read patterns and validating whether the data read is correct. Processing core 110 checks an error code resulting from the internal memory test and activates signal BISTERROR and then BISTDONE if an error is detected. If ASIC 100 passes the BIST test, test routines 128 enable use of a memory controller in interface 150 to download firmware from an external device.

In one embodiment of the invention, the BIST test of internal memory is only performed for system-level self-tests and not for production tests. Production testing of ASICs including internal memory such as DRAM often must identify the location of any defects in the memory to enable conventional laser repair operations. To identify the location of a defect in a memory array, the simple error signal timing illustrated in FIGS. 2A and 2B can be augmented to provide additional output signals indicating the exact location of any reparable defect in a memory array. However, the resulting increase in the complexity of output of the errors signals increases the complexity of test routines 128 so that a conventional memory array test method may be suited for production testing. For a system-level test, repair is generally not an option, and the memory testing that test routines 128 provides all the required information. As noted above, in the exemplary embodiment, the signal ASICTEST is activated or not to indicate whether a BIST of internal memory is required.

Figure 3:
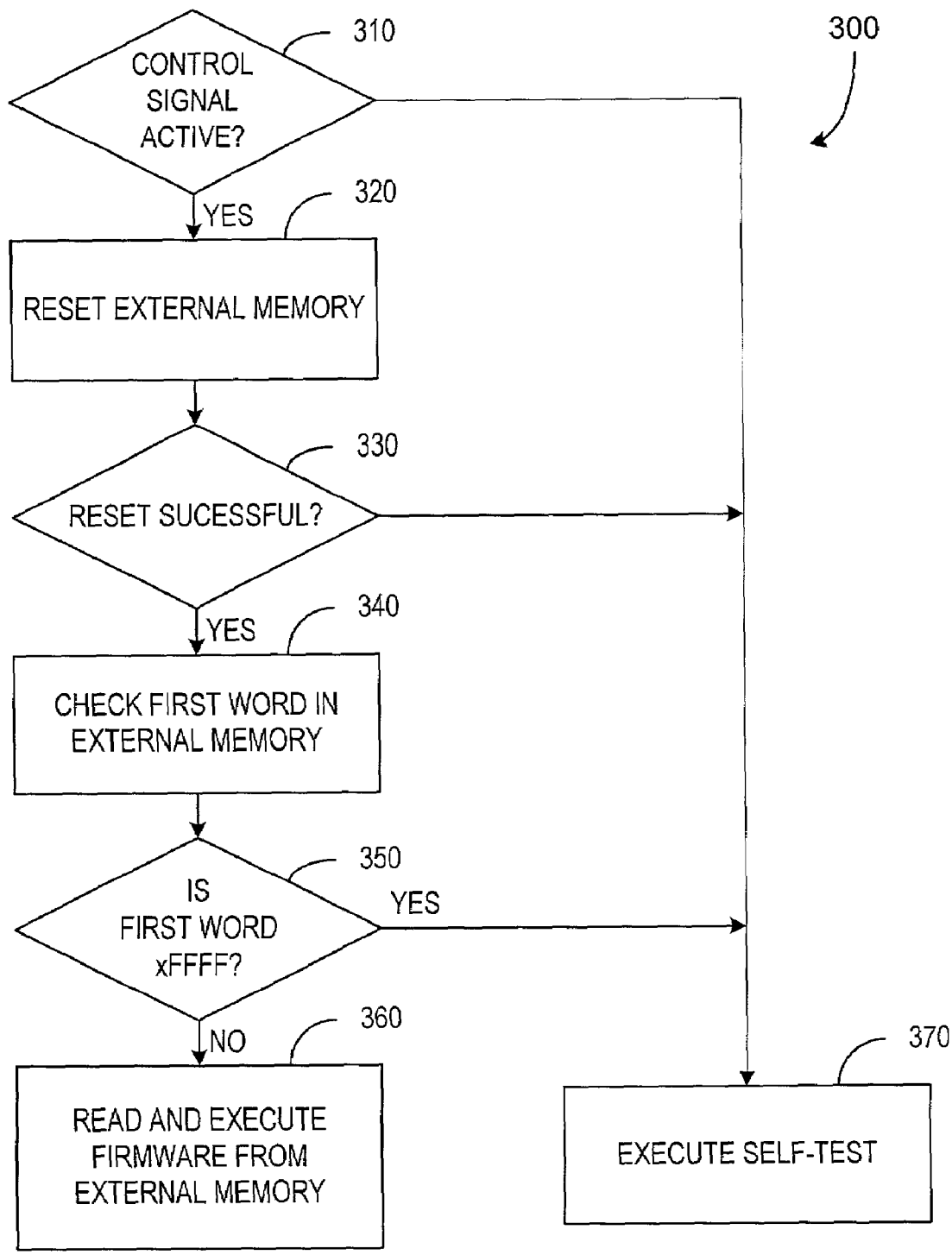
FIG. 3 is a flow diagram of an external memory portion of a test process in accordance with the invention.

After ASIC 100 passes the test in the BIST portion of test routines 128, processing core 110 executes the EEPROM portion of test routines 128. FIG. 3 is a flow diagram of a process 300 implemented in the EEPROM portion. Process 300 in an initial decision step 310 checks a control signal input via GPIO interface 130 (e.g., a pin GPIO[13]). If the control signal is not activated, processing core 110 executes of the self-test portion 370 of test routines 128.

If the control signal is activated, processing core 110 in step 320 attempts to reset an external memory such as an external serial EEPROM and then jumps to executing self-test routines 370 if the reset operation failed (e.g., because no external memory is connected). If the reset operation is successful, processing core 110 in step 340 reads or checks identifying data that should be stored in the external memory and then in a decision step 350 determines whether the external memory contains expected information, e.g., the first word has a value not equal xFFFF. If the external memory contains the expected information, processing core 110 in step 350 downloads firmware to internal memory 120 and executes that firmware, instead of continuing execution of test routines 128. If the external memory does not provide the expected information, processing core 110 jumps from decision step 350 to execute the self-test portion 370 of test routines 128.

The ability to load firmware from external memory during the boot process facilitates implementation of tests that are specialized for debugging the design of ASIC 100 or specialized for the particular system using ASIC 100. A co-owned U.S. patent application entitled, "Point-Of-Sale Demonstration of Computer Peripherals", describes use of the firmware download capability to implement non-testing functions (e.g., providing a system demonstration) and is hereby incorporated by reference in its entirety.

The self-test portion of test routines 128 verifies the operation of the major blocks within ASIC 100. In particular, in the exemplary embodiment, the self-test portion of test routines 128 tests interface 150, DMA block 170, and codec 140. Additional testing of internal memory 120 can also be performed.

The specific tests of particular blocks depend on the specific functions of the block. For example, for codec 140, processing core 110 can direct data form internal memory 120 to codec 140 for coding or decoding. Processing core 110 then determines whether the output data from codec 140 matches correctly coded or decoded data that is stored in ROM 126.

To provide tests that replicate actual system operation, test routines can try to emulate the normal data flow in ASIC 100. For example, a normal data flow in the exemplary embodiment starts with input of data to an input FIFO buffer in USB interface 150. The input FIFO buffer can include a normal input path from external circuits and an alternative input path that allows processing core 110 to write data into the input FIFO buffer to start a data flow. Similarly, processing core 110 can read data in an output buffer to check data output.

A data flow can proceed from the input FIFO buffer to internal memory 120, from internal memory 120 to codec 140 for coding, back to internal memory 120, from internal memory 120 to codec 140 for decoding or to DMA block 170. The proper passage of data through the entire system provides a high degree of verification of the operation of ASIC 100. Additionally, testing a data flow through several functional blocks may avoid the need to separately test each data transfer step because processing core 110 can observe the data at the final stage of the flow to detect errors. To further facilitate error checking, the last functional block in the data flow, e.g., DMA block 170 can include a CRC code calculator, so that processing core 110 only needs to check a CRC code instead of the entire output data stream.

Although the functional blocks of ASIC 100 can be conventional in implementation, specific features can be built into various functional block to facilitate test operations executed embedded processor 110. For example, the DMA block 170 can include circuitry that performs the CRC calculations to allow error detection without requiring processing core 110 to monitor the entire data stream. Input blocks such as USB interface 150 can provide paths that permit processing core 110 to write input values into incoming FIFO buffers to simulate data input when testing a data flow. Implementations of "loopback test" capabilities in the functional block can facilitate tests executed by processing core 110. Such tests would be particularly useful for testing on-chip network interfaces.

Figure 4:
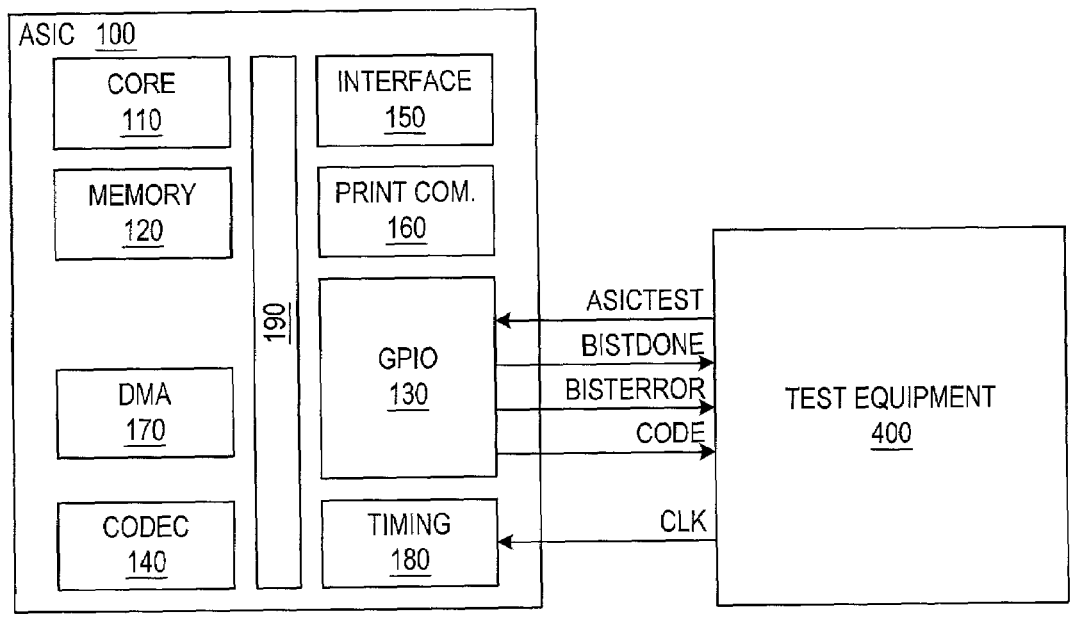
FIG. 4 is a block diagram of an ASIC connected to test equipment for production testing in accordance with an embodiment of the invention.

Processing core 110 can also test data flow through the blocks of ASIC 100 at specific clock speeds used in ASIC 100 and determine whether the blocks are meeting the required timing. For this testing, the clock and reset pins of ASIC 100 can driven during production or system-level testing in the manner required for normal operation of ASIC 100. Conventional test equipment 400 as illustrated in FIG. 4 can easily implement the timing signal CLK and control signals ASICTEST to test ASIC at full speed or at an elevated speed, for example, to prove timing margins during production testing.

In the above test process, processing core 110 can provide a failure code CODE in addition to asserting signal BISTERROR. Failure code CODE would indicate the nature or the location of the failure found during testing. For example, the value a 2-bit failure code can designate that whether the detected failure is in internal memory 120, codec 140, DMA block 170, or interface block 150.

Figure 5:
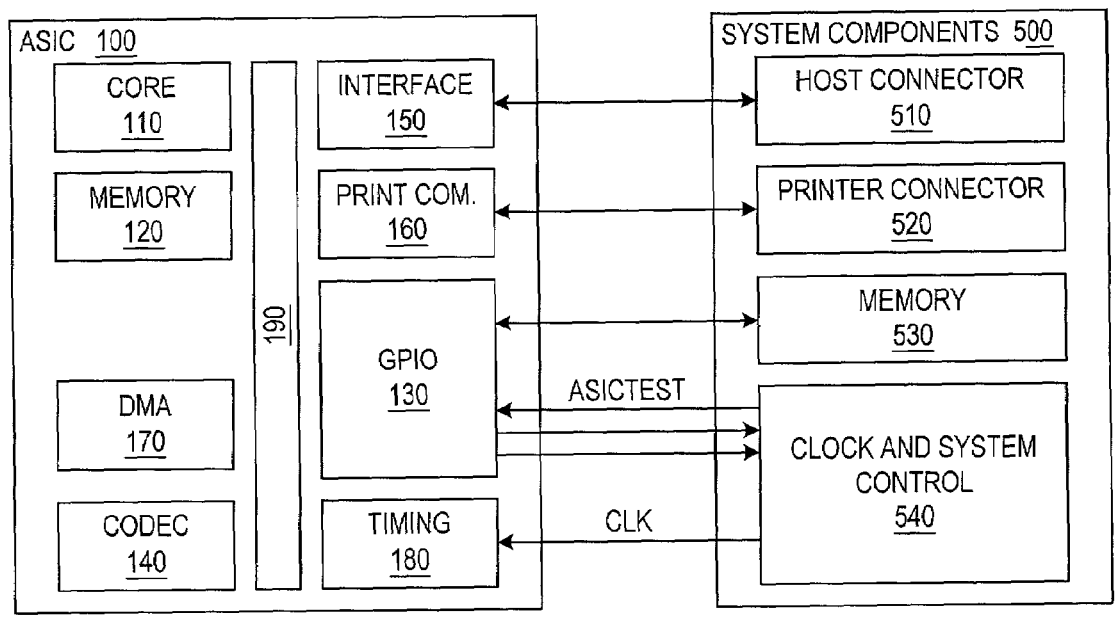
FIG. 5 is a block diagram of an ASIC in a system capable of system-level testing in accordance with an embodiment of the testing.

In a product, ASIC 100 is connected to other system components 500 such as illustrated in FIG. 5. In the embodiment of FIG. 5, for example, external interface 150 is connected to a host connector 510 for connection to a host computer or external memory, and print engine communications 160 connects to a printer connector 520 of a printer. Clock and system control circuit 540 and an optional external memory 530 connect to timing circuits 180 and GPIO interface 130. For system-level testing, system control 540 controls signal ASICTEST to select a system-level test and monitors signals BISTDONE and BISTERROR to determine whether ASIC 100 is functioning properly. In a system such as illustrated in FIG. 5, when executing test routines, which may be from internal memory 120 or downloaded to ASIC 100 from memory 530, processing core 110 can test ASIC 100 and any of the other system components 500.

Although the invention has been described with reference to particular embodiments, the description is only an example of the invention's application and should not be taken as a limitation. For example, although the above-described embodiment is a formatter for a printer, embodiments of the invention can be employed in other types of integrated circuits. Various other adaptations and combinations of features of the embodiments disclosed are within the scope of the invention as defined by the following claims.

We claim:

1. An integrated circuit comprising:
   a processing core;
   an internal memory containing test routines that the processing core executes to test the integrated circuit, wherein the internal memory contains a first set of test routines for execution during a production test of the integrated circuit and a second set of test routines for execution during an in-product test of the integrated circuit, and wherein a control signal input to the integrated circuit controls whether the first or second set of routines are executed; and
   an interface coupled to the processing core to permit activation of a first output signal indicating a test result from executing the test routines.

2. The integrated circuit of claim 1, wherein the processing core executes the test routines in response to a reset signal.

3. The integrated circuit of claim 2, wherein the interface block comprises:
   a first terminal on which the processing core activates the first output signal to indicate the test result; and
   a second terminal on which the processing core activates a second output signal to indicate when the first output signal indicates the test result.

4. The integrated circuit of claim 3, wherein the processor toggles the first output signal to verify that the first output signal is functional.

5. The integrated circuit of claim 1, wherein the processing core executes the test routines from the internal memory during a production test of the integrated circuit.

6. The integrated circuit of claim 1, wherein the test routines include tests of the internal memory.

7. A test method for an integrated circuit, comprising:
   using a processing core in the integrated circuit to execute test routines stored in the integrated circuit;
   observing a first signal output from the integrated circuit as a result of the processing core executing the test routines, the first signal indicating whether the execution of the test routines detected a failure in the integrated circuit;
   applying a control signal to the integrated circuit; and
   selecting the test routines according to the control signal;
   wherein:
      when the control signal has a first state, selected test routines implement a production test of the integrated circuit; and
      when the control signal has a second state, selected test routines implement a system-level test of the integrated circuit.

8. The test method of claim 7, further comprising observing a second signal output from the integrated circuit, wherein the processing core in executing the test routines activates the second signal to indicate when a state of the first signal indicates whether the execution of the test routines detected a test failure.

9. The test method of claim 8, further comprising activating the first signal before activation of the second signal to verify that the first signal is functional.

10. The test method of claim 9, activating an input signal to the integrated circuit causes the processing core to execute the test routines, wherein activating the first signal before activation of the second signal is in response to the activating of the input signal.

11. The test method of claim 7, observing one or more additional signals from the integrated circuit, wherein the processing core controls the additional signals to indicate a type of failure that executing the test routines detected.

12. The test method of claim 7, wherein the test method is performed during production of the integrated circuit.

13. The test method of claim 12, further comprising controlling an input signal to the integrated circuit to select which of the test routines stored in the integrated circuit are executed.

* * * * *